US008854614B2

(12) United States Patent
Kang et al.

(10) Patent No.: US 8,854,614 B2
(45) Date of Patent: Oct. 7, 2014

(54) METHODS OF THERMALLY TREATING A SEMICONDUCTOR WAFER

(71) Applicant: Samsung Electronics Co., Ltd., Suwon-si (KR)

(72) Inventors: Jong-Hoon Kang, Seoul (KR); Taegon Kim, Seoul (KR); Hanmei Choi, Seoul (KR); Eunyoung Jo, Seoul (KR); Gonsu Kang, Hwaseong-si (KR); Sungho Kang, Hwaseong-si (KR); Sungho Heo, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 24 days.

(21) Appl. No.: 13/715,099

(22) Filed: Dec. 14, 2012

(65) Prior Publication Data

US 2013/0171744 A1    Jul. 4, 2013

(30) Foreign Application Priority Data

Dec. 29, 2011  (KR) .......................... 10-2011-0145765

(51) Int. Cl.

| G01N 21/00 | (2006.01) |
|---|---|
| H01L 21/66 | (2006.01) |
| H01L 21/68 | (2006.01) |
| H01L 21/324 | (2006.01) |
| H01L 21/67 | (2006.01) |

(52) U.S. Cl.
CPC .............. *H01L 21/324* (2013.01); *H01L 22/12* (2013.01); *H01L 21/681* (2013.01); *H01L 22/10* (2013.01); *H01L 21/67115* (2013.01); *H01L 21/67288* (2013.01); *H01L 22/20* (2013.01)
USPC .............. 356/237.4; 356/31; 438/795; 438/5; 438/7; 438/308; 438/663; 257/E21.12; 257/E21.324; 257/E21.454; 257/E21.497; 257/E21.529; 257/E29.106; 257/E29.107; 392/411; 392/416; 392/418

(58) Field of Classification Search
CPC .............................. H01L 21/324; H01L 22/10
USPC .................. 257/E21.12, E21.324, E21.454, 257/E21.497, E21.529, E29.106, E29.107; 438/663, 308, 7, 795, 5; 392/416, 418, 392/411; 356/237.4, 31
See application file for complete search history.

(56) References Cited

U.S. PATENT DOCUMENTS 5,154,730 A * 10/1992 Hodos et al. .................. 29/25.01
5,439,850 A *  8/1995 Ozturk et al. .................. 438/488

(Continued)

FOREIGN PATENT DOCUMENTS

| JP | 2000-252335 | 9/2000 | |
|---|---|---|---|
| JP | 2005072045 A * | 3/2005 | ............ H01L 21/265 |

(Continued)

OTHER PUBLICATIONS

Moslehi, "Process Uniformity and Slip Dislocation Patterns in Linearly Ramped-Temperature Transient Rapid Thermal Processing of Silicon", IEEE Trans. Sem. Manuf., vol. 2, pp. 130-140 (1989).*

(Continued)

*Primary Examiner* — Marvin Payen
*Assistant Examiner* — Victor Barzykin
(74) *Attorney, Agent, or Firm* — F. Chau & Associates, LLC

(57) ABSTRACT

A method of thermally treating a wafer includes loading a wafer into a process chamber having one or more regions of uniform temperature gradient and one or more regions of non-uniform temperature gradient. A defect is detected in the wafer. The wafer is aligned to position the defect within one of the one or more regions of uniform temperature gradient. A rapid thermal process is performed on the wafer in the process chamber while the defect is positioned within one of the one or more regions of uniform temperature gradient.

15 Claims, 9 Drawing Sheets

(56) References Cited

U.S. PATENT DOCUMENTS

| | | | | |
|---|---|---|---|---|
| 5,446,825 A | * | 8/1995 | Moslehi et al. | 392/416 |
| 5,506,672 A | * | 4/1996 | Moslehi | 356/514 |
| 5,831,249 A | * | 11/1998 | Rohner et al. | 219/413 |
| 6,235,543 B1 | * | 5/2001 | Kiyama | 438/5 |
| 6,391,804 B1 | * | 5/2002 | Grant et al. | 438/795 |
| 6,710,364 B2 | * | 3/2004 | Guldi et al. | 250/559.44 |
| 6,800,833 B2 | * | 10/2004 | Gregor et al. | 219/390 |
| 7,045,458 B2 | * | 5/2006 | Ito et al. | 438/662 |
| 7,079,237 B2 | * | 7/2006 | Woo et al. | 356/237.2 |
| 7,107,125 B2 | * | 9/2006 | Yim et al. | 700/258 |
| 7,161,671 B2 | * | 1/2007 | Shibata et al. | 356/237.2 |
| 7,317,870 B2 | * | 1/2008 | Timans et al. | 392/416 |
| 7,378,618 B1 | * | 5/2008 | Sorabji et al. | 219/411 |
| 7,453,090 B2 | * | 11/2008 | Ito | 257/75 |
| 7,508,504 B2 | * | 3/2009 | Jin et al. | 356/237.4 |
| 7,616,872 B2 | * | 11/2009 | Camm et al. | 392/416 |
| 7,759,259 B2 | * | 7/2010 | Ito | 438/763 |
| 7,813,542 B2 | * | 10/2010 | Lee et al. | 382/151 |
| 7,876,432 B2 | * | 1/2011 | Yamamoto et al. | 356/237.5 |
| 8,000,587 B2 | * | 8/2011 | Timans et al. | 392/411 |
| 8,057,602 B2 | * | 11/2011 | Koelmel et al. | 118/730 |
| 8,107,800 B2 | * | 1/2012 | Bezama et al. | 392/418 |
| 8,142,885 B2 | * | 3/2012 | Nakai et al. | 428/220 |
| 8,222,574 B2 | * | 7/2012 | Sorabji et al. | 219/444.1 |
| 2004/0073398 A1 | * | 4/2004 | Nikoonahad et al. | 702/155 |
| 2004/0095575 A1 | | 5/2004 | Woo et al. | |
| 2006/0096677 A1 | | 5/2006 | Camm et al. | |
| 2006/0127067 A1 | * | 6/2006 | Wintenberger et al. | 392/416 |
| 2006/0291832 A1 | * | 12/2006 | Ito | 392/416 |
| 2007/0243701 A1 | * | 10/2007 | Ito et al. | 438/514 |
| 2008/0141556 A1 | * | 6/2008 | Sorabji et al. | 34/380 |
| 2008/0200100 A1 | * | 8/2008 | Takahashi et al. | 451/44 |
| 2008/0268660 A1 | * | 10/2008 | Itani et al. | 438/795 |
| 2009/0016853 A1 | * | 1/2009 | Yoo | 414/147 |
| 2010/0008656 A1 | * | 1/2010 | Sorabji et al. | 392/416 |
| 2010/0075267 A1 | * | 3/2010 | Sadohara et al. | 432/1 |
| 2010/0133257 A1 | * | 6/2010 | Sorabji et al. | 219/447.1 |
| 2010/0171823 A1 | | 7/2010 | Yamamoto et al. | |
| 2011/0034015 A1 | * | 2/2011 | Yoshino et al. | 438/585 |
| 2011/0050882 A1 | * | 3/2011 | Lee et al. | 348/95 |
| 2011/0177624 A1 | * | 7/2011 | Camm et al. | 438/7 |
| 2012/0001301 A1 | * | 1/2012 | Ebara et al. | 257/617 |
| 2012/0043644 A1 | * | 2/2012 | Ono et al. | 257/607 |
| 2012/0276660 A1 | * | 11/2012 | Aderhold et al. | 438/5 |
| 2012/0306052 A1 | * | 12/2012 | Ono et al. | 257/607 |
| 2013/0039471 A1 | * | 2/2013 | Wormington et al. | 378/81 |

FOREIGN PATENT DOCUMENTS

| | | | |
|---|---|---|---|
| JP | 2007-149903 | | 6/2007 |
| JP | 2007221157 A | * | 8/2007 |
| JP | 2010-161193 | | 7/2010 |
| JP | 2010153889 A | * | 7/2010 |
| KR | 10-0492158 | | 5/2005 |
| KR | 10-2006-0053294 | | 5/2006 |
| KR | 10-2007-0019387 | | 2/2007 |
| KR | 10-2008-0017205 | | 2/2008 |

OTHER PUBLICATIONS

Ito et al., "Flash lamp anneal technology for effectively activating ion implanted Si" Extended Abstracts of the 2001 International Conference on Solid State Devices and Materials, Tokyo, 2001, pp. 182-183.*

Bentini et al., "Defects introduced in silicon wafers during rapid thermal annealing: thermoelastic and thermoplastic effects", J. Appl. Phys. 56, 2922 (1984).*

* cited by examiner

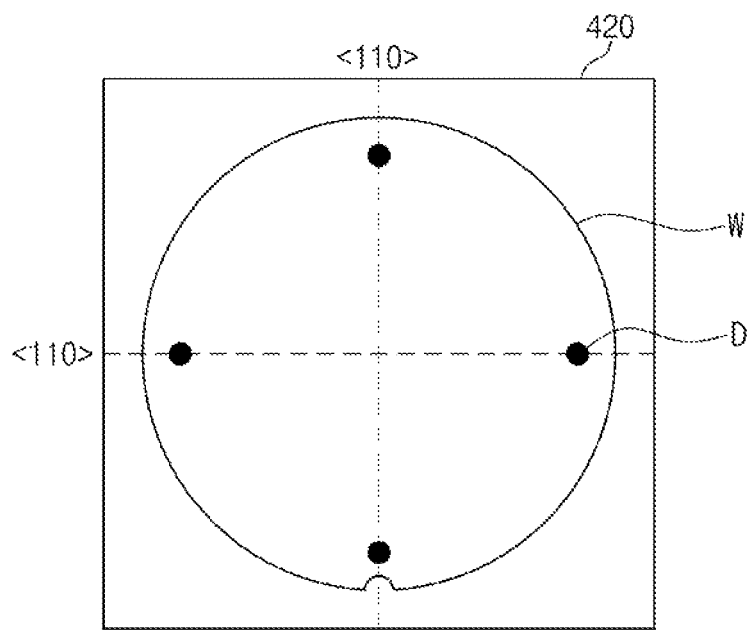

METHODS OF THERMALLY TREATING A SEMICONDUCTOR WAFER

CROSS-REFERENCE TO RELATED APPLICATIONS

This U.S. non-provisional patent application claims priority under 35 U.S.C. §119 to Korean Patent Application No. 10-2011-0145765, filed on Dec. 29, 2011, the entirety of which is incorporated by reference herein.

TECHNICAL FIELD

The inventive concept relates to semiconductor wafers and, more particularly, to methods of thermally treating a semiconductor wafer.

DISCUSSION OF THE RELATED ART

In a method of manufacturing a semiconductor device, an annealing process may be performed after an ion implantation process is performed. The annealing process may be a thermal treatment process performed at a high-temperature. The annealing process may activate implanted impurities. During the anneal process; steps may be taken to minimize diffusion of the impurities into the semiconductor device.

An example of a commonly used annealing process is the rapid thermal process (RTP). RTP is an example of a millisecond annealing process. The millisecond annealing process may transmit radiant heat energy emitted from a lamp to a wafer in a short amount of time, generally on the order of milliseconds, thereby heating the wafer.

SUMMARY

Embodiments of the inventive concept may provide methods of thermally treating a wafer capable of preventing the wafer from breaking.

According to an aspect of the present inventive concept, a method of thermally treating a wafer may include detecting a defect of the wafer. The wafer is aligned to locate the defect within regions of a process chamber that are not non-uniform temperature gradient regions. A rapid thermal process is performed on the wafer in the process chamber.

In some embodiments, the process chamber may have a hexahedron-shape such as a cube. A cross-section of the chamber may be a quadrangle. The non-uniform temperature gradient regions may be located within corner regions of the quadrangular cross section.

According to exemplary embodiments, the rapid thermal process may be a flash lamp annealing process.

According to exemplary embodiments, detecting the defect of the wafer may include rotating the wafer and taking a photograph of a surface image of the wafer using a fixed camera.

According to exemplary embodiments, detecting the defect of the wafer may include fixing the wafer, moving a camera around the wafer, and taking a photograph of a surface image of the wafer using the camera.

According to exemplary embodiments, detecting the defect of the wafer may include fixing the wafer, rotating an optical axis of a camera with respect to the wafer, and taking a photograph of a surface image of the wafer using the camera.

According to exemplary embodiments, the method may further include detecting crystal direction of the wafer and aligning the wafer to face the crystal direction of the wafer toward other regions of the process chamber that are not non-uniform temperature gradient regions, for example, the crystal direction of the wafer may be aligned to face regions that are not corner regions.

According to exemplary embodiments, detecting the crystal direction of the wafer may include rotating the wafer and taking a photograph of a notch of the wafer using a fixed camera.

According to exemplary embodiments, detecting the crystal direction of the wafer may include fixing the wafer, moving a camera around the wafer, and taking a photograph of a notch of the wafer using the camera.

According to exemplary embodiments, the process chamber may include a chamber housing having a hexahedron-shape. The chamber may also have a quadrangle-cross section. The wafer is set on a supporting member. The supporting member is disposed in the chamber housing. A first arc lamp is disposed under the supporting member. The first arc lamp bulk-heats the wafer at a first temperature. A second arc lamp is disposed over the supporting member. The second arc lamp heats the wafer in a short time of approximately several milliseconds at a second temperature that is higher than the first temperature. The wafer may be aligned so as to avoid corner regions of the chamber housing and then the wafer may be loaded on the supporting member.

According to an exemplary embodiment, a method of thermally treating a wafer may include detecting crystal direction of the wafer. The wafer may be aligned to face the crystal direction of the wafer toward regions of a process chamber that are not non-uniform temperature gradient regions. A rapid thermal process is performed on the wafer in the process chamber.

In some embodiments, the process chamber may have a hexahedron-shape and may have a quadrangle-cross section. The non-uniform temperature gradient regions may be corner regions of the quadrangle-cross section.

According to exemplary embodiments, detecting the crystal direction of the wafer may include rotating the wafer and taking a photograph of a notch of the wafer using a fixed camera.

According to exemplary embodiments, detecting the crystal direction of the wafer may include fixing the wafer, moving a camera around the wafer, and taking a photograph of a notch of the wafer using the camera.

According to exemplary embodiments, the rapid thermal process may be a flash lamp annealing process.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 10A to 10C are plan views illustrating wafer alignment states capable of preventing a wafer from breaking according to exemplary embodiments of the inventive concept.

DETAILED DESCRIPTION OF THE EMBODIMENTS

Figure 1:
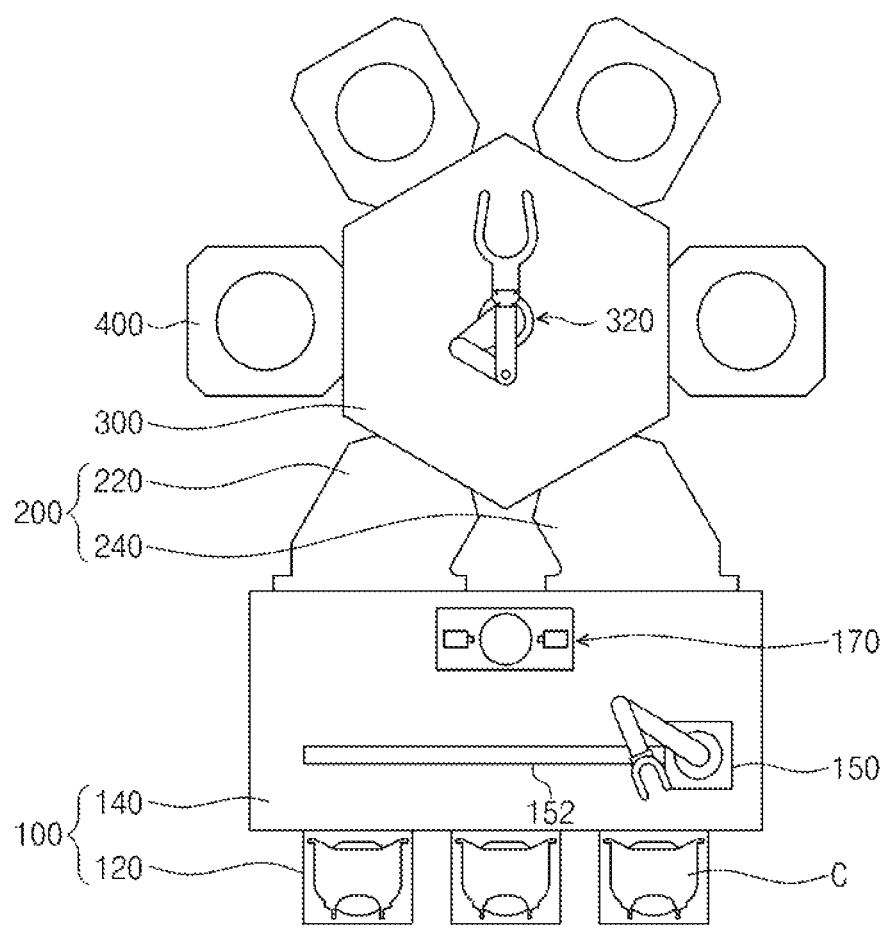
FIG. 1 is a plan view illustrating an apparatus for thermally treating a wafer in accordance with exemplary embodiments of the present invention.

The inventive concept will now be described more fully hereinafter with reference to the accompanying drawings, in which exemplary embodiments of the inventive concept are shown. Exemplary embodiments of the present invention are described in more detail below with reference to the accompanying drawings. It should be noted, however, that the inventive concept is not limited to the following exemplary embodiments, and may be implemented in various forms. In the drawings, various structural details may be exaggerated for clarity.

It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

Shapes of the exemplary views illustrated in the figures may be modified according to manufacturing techniques and/or allowable errors. Therefore, the embodiments of the inventive concept are not limited to the specific shape illustrated in the exemplary views, but may include other shapes that may be created according to manufacturing processes.

The same reference numerals or the same reference designators may denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a plan view illustrating an apparatus for thermally treating a wafer. Referring to FIG. 1, the apparatus 10 for thermally treating a wafer may include an equipment front-end module (EFEM) 100, a load lock chamber 200, a transfer chamber 300, and process chambers 400.

The EFEM 100 may include a plurality of load ports 120 and a frame 140. The load ports 120 may be arranged in a particular direction, and the frame 140 may be located between the load ports 120 and the load lock chamber 200. Containers C receiving wafers may be airtight containers such as front open unified pods (FOUP). The containers C are set on the load ports 120, respectively.

A door opener (not shown), a first transfer robot 150, and a wafer alignment unit 170 may be installed in the frame 140. The door opener (not shown) may automatically open and close doors of the containers C set on the load ports 120. The first transfer robot 150 may move along a transfer rail 152. The first transfer robot 150 may transfer the wafer between the containers C set on the load ports 120 and the load lock chamber 200. For example, in a wafer loading process, the first transfer robot 150 transfers the wafer from the container C to the wafer alignment unit 170 and then transfers the wafer from the wafer alignment unit 170 to the load lock chamber 200. In a wafer unloading process, the first transfer robot 150 transfers the wafer from load lock chamber 200 to the container C. The wafer alignment unit 170 detects a defect of the wafer and/or crystal direction of the wafer. And the wafer alignment unit 170 aligns the defect and/or crystal direction of the wafer with a predetermined direction. The wafer alignment unit 170 will be described in more detail later.

The load lock chamber 200 is disposed at the rear of the EFEM 100. The load lock chamber 200 includes a loading chamber 220 and an unloading chamber 240. For performing a manufacturing process, the wafer temporarily stays in the loading chamber 220 before the wafer is inserted in the process chamber 400. After the manufacturing process is finished, the wafer going out of the process chamber 400 temporarily stay in the unloading chamber 240. If the aligned wafer is inserted in the loading chamber 220, a controller (not shown) reduces pressure of the inside of the loading chamber 220 so that the inside of the loading chamber 220 can become in an initial low vacuum state. Thus, it is possible to prevent external contamination materials from flowing into the transfer chamber 300 and the process chambers 400.

The transfer chamber 300 is disposed adjacent to a side of the load lock chamber 200. The process chambers 400 are disposed around the transfer chamber 300. A second transfer robot 320 for transferring the wafer is provided in the transfer chamber 300. The second transfer robot 320 transfers the wafer between the load lock chamber 200 and the process chambers 400.

Each of the process chambers 400 provides a space in which a rapid thermal process (RTP) of the wafer is performed. For example, the rapid thermal process may be a flash lamp annealing process. The flash lamp annealing process heats the wafer using radiant heat energy of a lamp in a short time of, for example, several milliseconds. Impurities implanted into the wafer may be activated by the flash lamp annealing process.

Openings (not shown) for transferring the wafer may be formed between the load lock chamber 200 and the transfer chamber 300 and between the transfer chamber 300 and the process chambers 400. The opening (not shown) is opened and closed by a gate valve (not shown). The gate valve controls inflow of gas and impurity through the opening and interrupts pressure transmission between the chambers.

Figure 2:
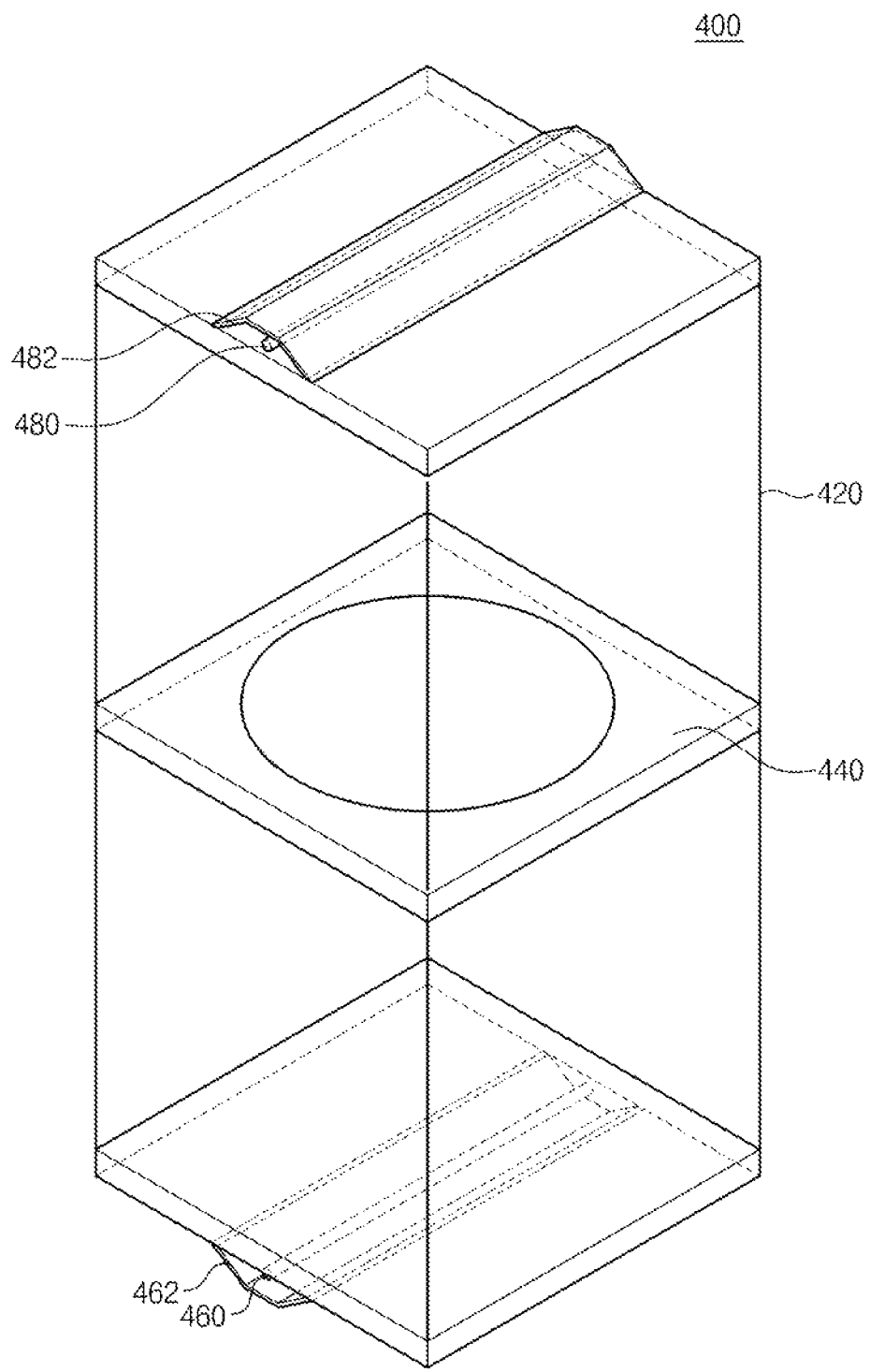
FIG. 2 is a perspective view illustrating a process chamber of FIG. 1.

FIG. 2 is a perspective view illustrating a process chamber of FIG. 1. Referring to FIG. 2, the process chamber 400 includes a chamber housing 420, a supporting member 440, a first arc lamp 460, and a second arc lamp 480.

The chamber housing 420 has a hexahedron-shape with a quadrangle-cross section. The supporting member 440 is located at a center portion of the chamber housing 420 and supports the wafer. The first arc lamp 460 is disposed under the supporting member 440. The first arc lamp may bulk-heat the wafer at a first temperature. A first reflection plate 462 is provided under the first arc lamp 460. The first reflection plate 462 may reflect an electromagnetic radiant energy of the first arc lamp 460 upward to the wafer. The second arc lamp 480 is disposed over the supporting member 440. The second arc lamp 480 may heat the wafer in a short time of milliseconds at a second temperature higher than the first temperature. A second reflection plate 482 is provided over the second arc lamp 480. The second reflection plate 482 may reflect an electromagnetic radiant energy of the second arc lamp 480 downward to the wafer.

Figure 3:
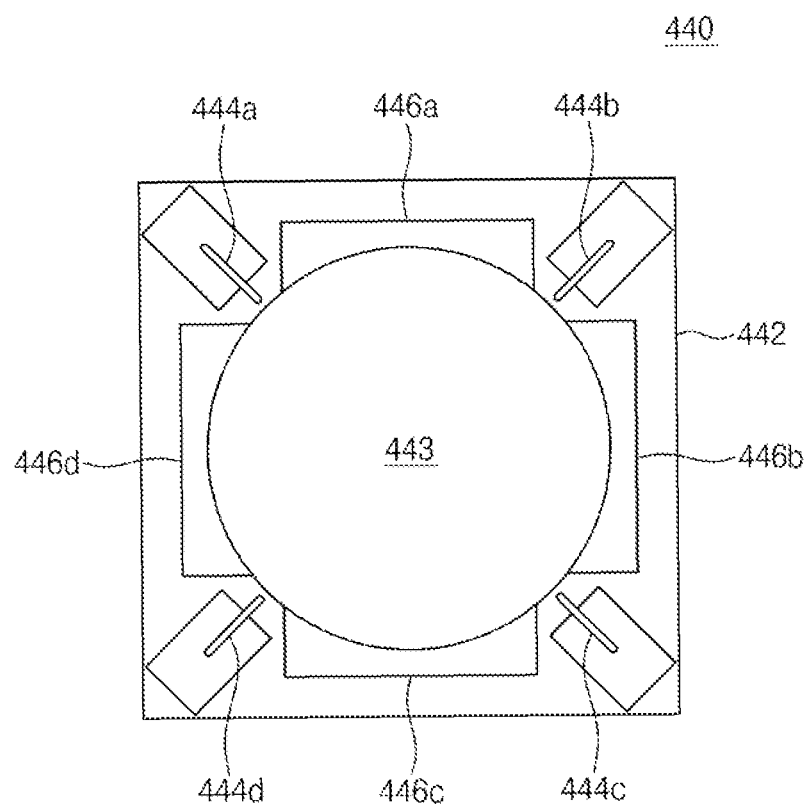
FIG. 3 is a plan view illustrating a supporting member of FIG. 2.

FIG. 3 is a plan view illustrating a supporting member of FIG. 2. Referring to FIG. 3, the supporting member 440 includes a supporting plate 442, lift pins 444a, 444b, 444c, and 444d, and edge reflection plates 446a, 446b, 446c, and 446d.

The supporting plate 442 has a quadrangle-shape. A safe receipt surface 443, which the wafer is set on, is provided to a center region of the supporting plate 442. The lift pins 444a, 444b, 444c, and 444d are disposed on four corner regions of the supporting plate 442, respectively. The wafer loaded on the supporting plate 442 is supported by elevated lift pins 444a, 44b, 444c, and 444d. The wafer is set on the safe receipt surface 443 by descent of the lift pins 444a, 444b, 444c, and 444d. The edge reflection plates 446a, 446b, 446c, and 446d are provided between the lift pins 444a, 444b, 444c, and 444d, respectively, and are disposed adjacent to a circumference of the safe receipt surface 443. Reflection plates are not provided on some portions of the circumference of the safe receipt surface 443 that correspond to the four corner regions of the supporting plate 442, respectively. The edge reflection plates 446a, 446b, 446c, and 446d reflect the electromagnetic radiant energies of the first and second arc lamps 460 and 480 toward the wafer.

As described above, since the chamber housing 420 has the quadrangle-cross section, a non-uniform temperature gradient may occur in corner regions of the inside of the chamber housing 420. Additionally, since edge reflection plates are not provided in the some regions of the circumference of the safe receipt surface 443 that correspond to the four corner regions of the supporting plate 442, a non-uniform temperature gradient may occur in the wafer.

Figure 4A:
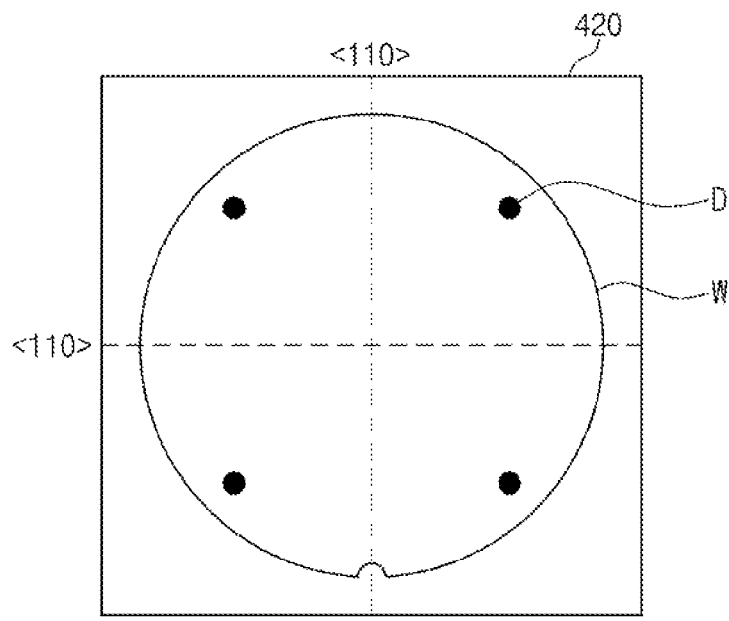
FIGS. 4A to 4C are plan views illustrating wafer alignment states causing breakage of a wafer.
Figure 4B:
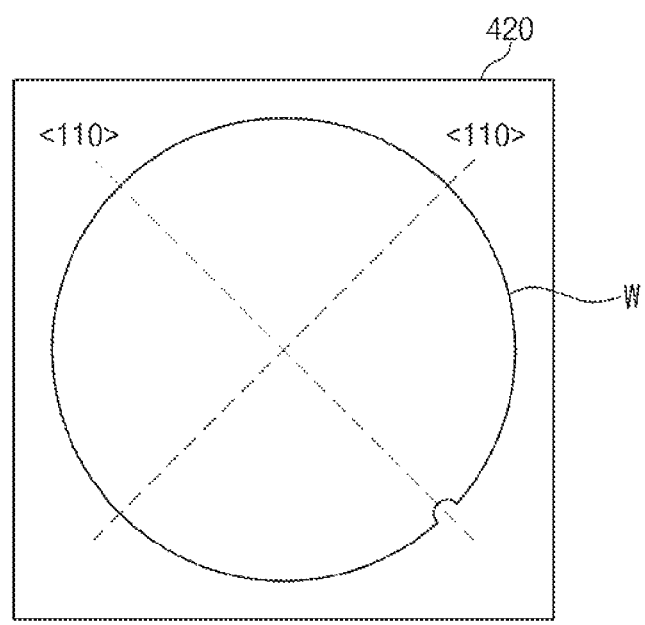
Figure 4C:
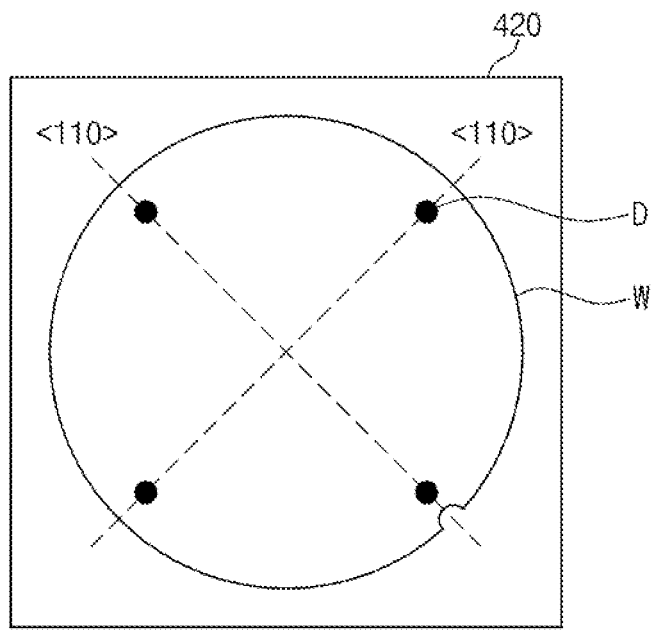

FIGS. 4A to 4C are plan views illustrating wafer alignment states causing breakage of a wafer. FIG. 4A illustrates defects D that are disposed in non-uniform temperature gradient regions (e.g. four corner regions) of the chamber housing 420. FIG. 4B illustrates the crystal direction <110> of the wafer that face toward the non-uniform temperature gradient regions of the chamber housing 420. FIG. 4C illustrates the defects D and the crystal direction <110> of the wafer that face toward the non-uniform temperature gradient regions of the chamber housing 420. If the wafer W is aligned as illustrated in FIGS. 4A to 4C, then the wafer W may be broken during the rapid thermal process. For example, if the non-uniform temperature gradient occurs in the chamber during the rapid thermal process of a high temperature, a thermal stress may occur in the wafer by the non-uniform temperature gradient. Additionally, slip dislocation may occur at locations of the defects D and/or in the crystal direction <110> of the wafer W and then the defects may be transmitted due to the thermal stress. Thus, the wafer W may be broken by the slip dislocation.

For solving the above problems, according to the inventive concept, after the wafer is aligned so that the defects and/or the crystal direction <110> of the wafer are not located in the non-uniform temperature gradient regions of the chamber, the rapid thermal process is performed on the wafer.

Figure 5:
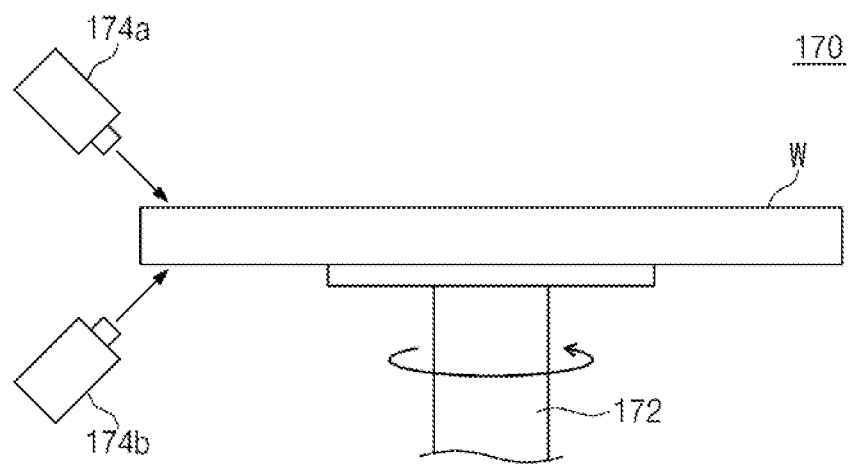
FIG. 5 is a cross-sectional view illustrating a wafer alignment unit according to exemplary embodiments of the inventive concept.

FIG. 5 is a cross-sectional view illustrating a wafer alignment unit according to an exemplary embodiment of the inventive concept. Referring to FIGS. 1 and 5, the wafer alignment unit 170 may be disposed in the frame 140 of the EFEM 100. The wafer alignment unit 170 may include an aligner 172 on which the wafer W is set, and first and second defect detectors 174a and 174b detecting defects of the wafer W. For example, the first and second defect detectors 174a and 174b may be cameras taking photographs of a surface of the wafer W. The first defect detector 174a is located over the wafer W set on the aligner 172 and the second defect detector 174b is located under the wafer W. The first and second defect detectors 174a and 174b may be fixed at predetermined locations, respectively.

Methods of detecting defects and aligning the wafer using the wafer alignment unit 170 described above will be described in more detail. The first transfer robot 150 takes the wafer W out of the container C and then transfers the wafer W onto the aligner 172. The aligner 172 is rotated in a state that the wafer is safely set on the aligner 172. The first defect detector 174a takes a photograph of an edge region of a top surface of the rotated wafer W and the second defect detector 174b takes a photograph of an edge region of a bottom surface of the rotated wafer W.

Figure 10A:
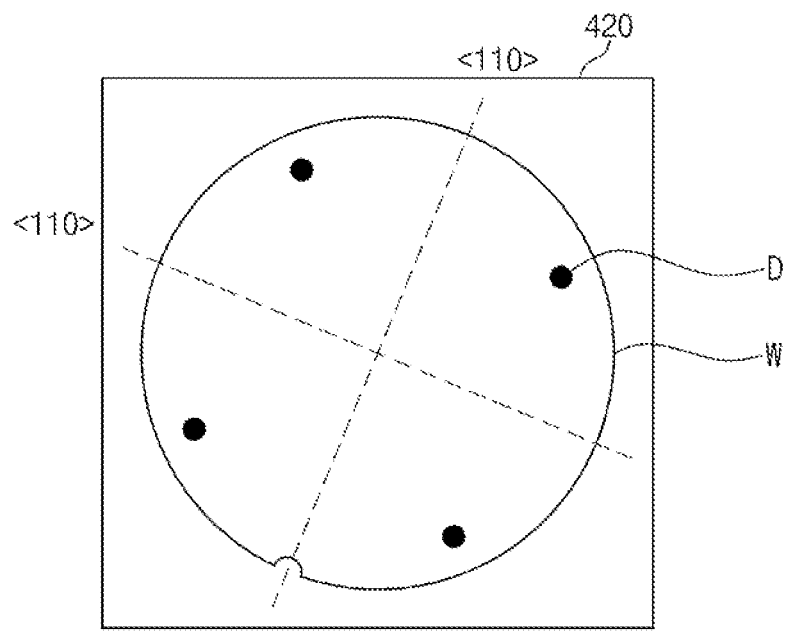

The images obtained by the first and second defect detectors 174a and 174b are transmitted to a controller (not shown). The controller (not shown) reads locations of the defects based on the images. Subsequently, the controller (not shown) rotates the aligner 172 such that the defects D of the wafer W are not disposed in the non-uniform temperature gradient regions of the chamber housing 420, as illustrated in FIGS. 10A and 10C.

Subsequently, the first transfer robot 150 loads the aligned wafer W into the loading chamber 220 of the load lock chamber 200 and then the second transfer robot 320 of the transfer chamber 300 takes out the aligned wafer W from the loading chamber 220. Subsequently, the second transfer robot 320 inserts the aligned wafer W into the process chamber 400. The aligned wafer W inserted in the process chamber 400 maintains the state aligned in the aligner 172. For example, the detected defects D of the wafer W are not disposed at the non-uniform temperature gradient regions (i.e. the corner regions) of the chamber housing 420, as illustrated in FIGS. 10A and 10C.

The rapid thermal process (e.g. the flash lamp annealing process) is performed in the process chamber 400 in the case described above.

Figure 6:
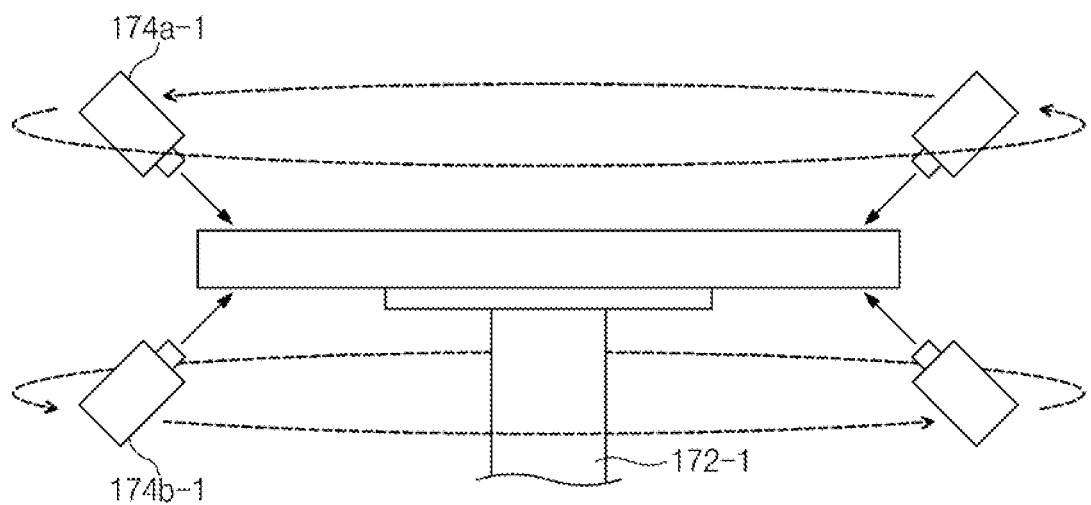
FIG. 6 is a cross-sectional view illustrating a wafer alignment unit according exemplary embodiments of the inventive concept.

FIG. 6 is a cross-sectional view illustrating a wafer alignment unit according to an exemplary embodiment of the inventive concept. Referring to FIGS. 1 and 6, a wafer alignment unit 170-1 may be disposed in the frame 140 of the EFEM 100. The wafer alignment unit 170-1 may include an aligner 172-1 on which the wafer W is set and first and second defect detectors 174a-1 and 174b-1 detecting defects of the wafer W. For example, the first and second defect detectors 174a-1 and 174b-1 may be cameras taking photographs of a surface of the wafer W. The first defect detector 174a-1 is located over the wafer W set on the aligner 172-1 and the second defect detector 174b-1 is located under the wafer W. The first and second defect detectors 174a-1 and 174b-1 may be rotated about a center axis of the aligner 172-1 by a driving member (not shown). For example, the first and second defect detectors 174a-1 and 174b-1 may move around the wafer W set on the aligner 172-1.

Methods of detecting defects and aligning the wafer using the wafer alignment unit 170-1 described above will be described in more detail. The wafer W is safely set on the aligner 172-1 and the aligner 172-1 is fixed. For example, the wafer W is fixed. The first defect detector 174a-1 takes a photograph of an edge region of a top surface of the wafer W as the first defect detector 174a-1 moves around the fixed wafer W. The second defect detector 174a-2 takes a photograph of an edge region of a bottom surface of the wafer W as the second defect detector 174a-2 moves around the fixed wafer W.

The images obtained by the first and second defect detectors 174a-1 and 174b-1 are transmitted to a controller (not shown). The controller (not shown) reads locations of the defects based on the images. Subsequently, the controller (not shown) rotates the aligner 172-1 so that the defects D of the wafer W are not disposed in the non-uniform temperature gradient regions of the chamber housing 420 (FIGS. 10A and 10C).

Subsequently, the first transfer robot 150 loads the aligned wafer W into the loading chamber 220 of the load lock chamber 200 and then the second transfer robot 320 of the transfer chamber 300 takes out the aligned wafer W from the loading chamber 220. Subsequently, the second transfer robot 320 inserts the aligned wafer W into the process chamber 400. The aligned wafer W inserted in the process chamber 400 maintains the state aligned in the aligner 172-1. For example, the detected defects D of the wafer W are not disposed at the non-uniform temperature gradient regions (e.g. the corner regions) of the chamber housing 420, as illustrated in FIGS. 10A and 10C.

Here, the rapid thermal process (e.g. the flash lamp annealing process) may be performed in the process chamber 400.

Figure 7:
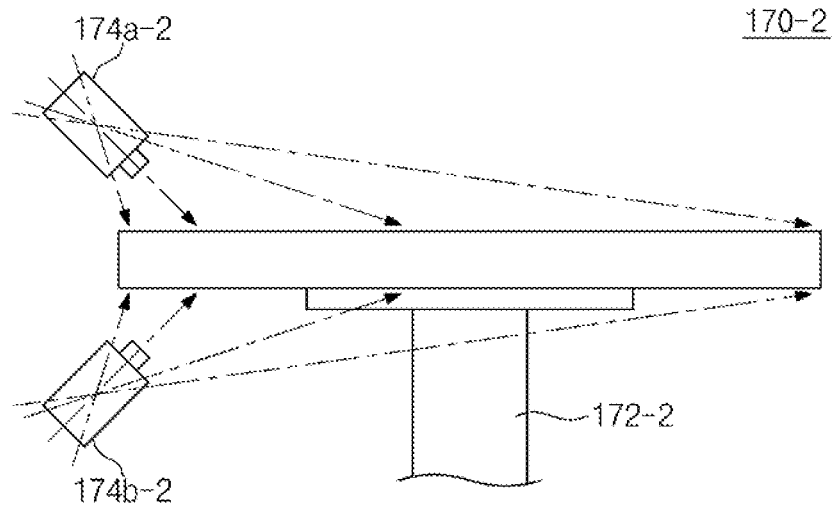
FIG. 7 is a cross-sectional view illustrating a wafer alignment unit according to exemplary embodiments of the inventive concept.

FIG. 7 is a cross-sectional view illustrating a wafer alignment unit according to an exemplary embodiment of the inventive concept. Referring to FIGS. 1 and 7, a wafer alignment unit 170-2 may be disposed in the frame 140 of the EFEM 100. The wafer alignment unit 170-2 may include an aligner 172-2 on which the wafer W is set and first and second defect detectors 174a-2 and 174b-2 detecting defects of the wafer W. For example, the first and second defect detectors 174a-2 and 174b-2 may be cameras taking photographs of a surface of the wafer W. The first defect detector 174a-2 is located over the wafer W set on the aligner 172-2, and the second defect detector 174b-1 is located under the wafer W.

The first defect detector 174a-2 may be rotated by a driving member (not shown) to scan an entire top surface of the wafer W. For example, the first defect detector 174a-2 may be rotated so that an angle between a center axis (e.g. an optical axis) of the first defect detector 174a-2 and the top surface of the wafer W can be continuously changed. The second defect detector 174b-2 may be rotated by a driving member (not shown) to scan an entire bottom surface of the wafer W. For example, the second defect detector 174b-2 may be rotated so that an angle between a center axis (e.g. an optical axis) of the second defect detector 174b-2 and the bottom surface of the wafer W can be continuously changed.

Methods of detecting defects and aligning the wafer using the wafer alignment unit 170-2 described above will be described in more detail. The wafer W is safely set on the aligner 172-2 and the aligner 172-2 is fixed. For example, the wafer W is fixed. The first defect detector 174a-2 takes a photograph of the top surface of the wafer W during rotating of the optical axis thereof and the second defect detector 174b-2 takes a photograph of the bottom surface of the wafer W during rotating of the optical axis thereof.

The images obtained by the first and second defect detectors 174a-2 and 174b-2 are transmitted to a controller (not shown). The controller (not shown) reads locations of the defects based on the images. Subsequently, the controller (not shown) rotates the aligner 172-2 so that the defects D of the wafer W is not disposed in the non-uniform temperature gradient regions of the chamber housing 420 (FIGS. 10A and 10C).

Subsequently, the first transfer robot 150 loads the aligned wafer W into the loading chamber 220 of the load lock chamber 200 and then the second transfer robot 320 of the transfer chamber 300 takes out the aligned wafer W from the loading chamber 220. Subsequently, the second transfer robot 320 inserts the aligned wafer W into the process chamber 400. The aligned wafer W inserted in the process chamber 400 maintains the state aligned in the aligner 172-2. For example, the detected defects D of the wafer W are not disposed at the non-uniform temperature gradient regions (i.e. the corner regions) of the chamber housing 420 (FIGS. 10A and 10C).

In this case, the rapid thermal process (e.g. the flash lamp annealing process) is performed in the process chamber 400.

Figure 8:
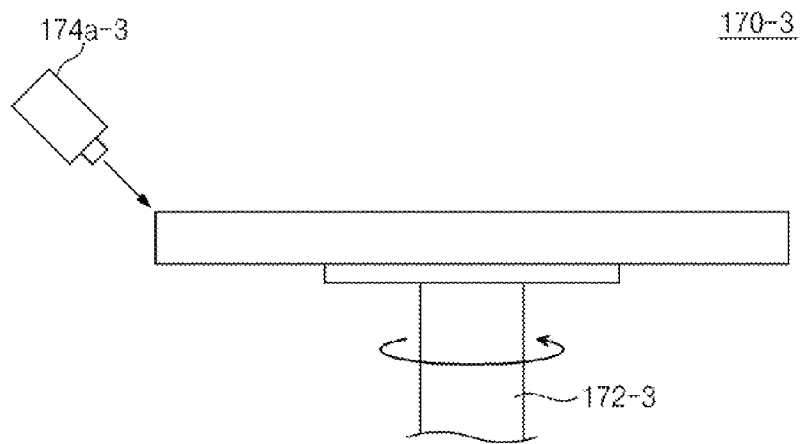
FIG. 8 is a cross-sectional view illustrating a wafer alignment unit according to exemplary embodiments of the inventive concept.

FIG. 8 is a cross-sectional view illustrating a wafer alignment unit according to an exemplary embodiment of the inventive concept. Referring to FIGS. 1 and 8, a wafer alignment unit 170-3 may be disposed in the frame 140 of the EFEM 100. The wafer alignment unit 170-3 may include an aligner 172-3 on which the wafer W is set and a notch detector 174a-3 detecting a notch of the wafer W. For example, the notch detector 174a-3 may be a camera taking a photograph of an edge sidewall of the wafer W. The notch detector 174a-3 may be located over or under the wafer W set on the aligner 172-3. The notch detector 174a-3 is fixed at a predetermined position.

Methods of detecting the notch and aligning the wafer using the wafer alignment unit 170-3 described above will be described in more detail.

Figure 10B:
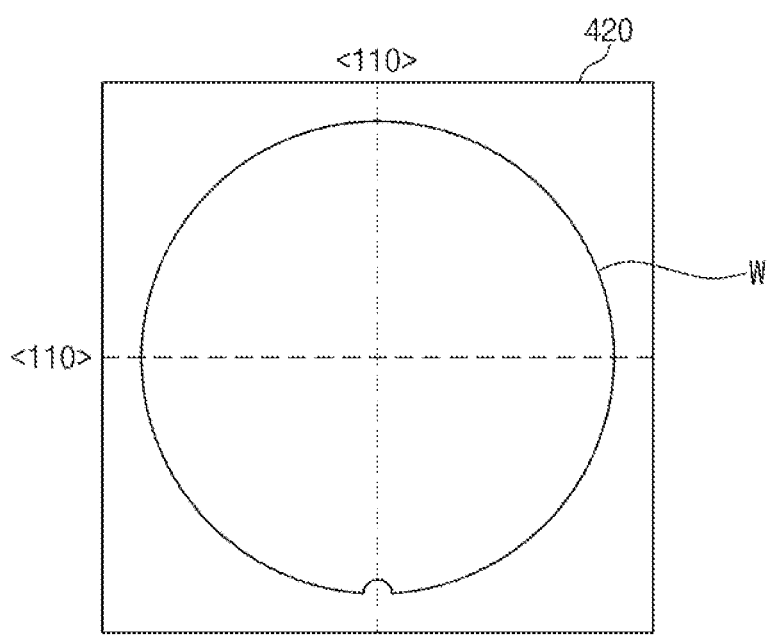

Here, for example, a main surface of the wafer, which patterns are formed on, may have the crystal plane. In this case, the notch may be formed at one of the crystal direction <110> of the wafer W as illustrated in FIGS. 10A to 10C. Alternatively, the notch may be formed at one of crystal direction <100> of the wafer. Hereinafter, the wafer having the notch formed at one of the crystal direction <110> will be used as an example.

The first transfer robot 150 takes out the wafer W from the container C and then transfers the wafer W onto the aligner 172-3. The aligner 172-3 is rotated in a state that the wafer W is safely set on the aligner 172-3. At this time, the notch detector 174a-3 takes a photograph of the edge sidewall of the rotated wafer W.

The image obtained by the notch detector 174a-3 is transmitted to a controller (not shown). The controller (not shown) rotates the aligner 172-3 so that the defected notch is not disposed in the non-uniform temperature gradient regions of the chamber housing 420. Since the notch may be formed at one of the crystal direction <110>, the crystal direction <110> of the wafer W are not disposed in the non-uniform temperature gradient regions (e.g. the corner regions) of the chamber housing 420 (FIGS. 10A and 10C).

Subsequently, the first transfer robot 150 loads the aligned wafer W into the loading chamber 220 of the load lock chamber 200 and then the second transfer robot 320 of the transfer chamber 300 takes out the aligned wafer W from the loading chamber 220. Subsequently, the second transfer robot 320 inserts the aligned wafer W into the process chamber 400. The aligned wafer W inserted in the process chamber 400 maintains the state aligned in the aligner 172-3. For example, the detected notch and the crystal direction <110> of the wafer W are not disposed at the non-uniform temperature gradient regions (e.g. the corner regions) of the chamber housing 420 (FIGS. 10A and 10C).

In the above case, the rapid thermal process (e.g. the flash lamp annealing process) is performed in the process chamber 400.

Figure 9:
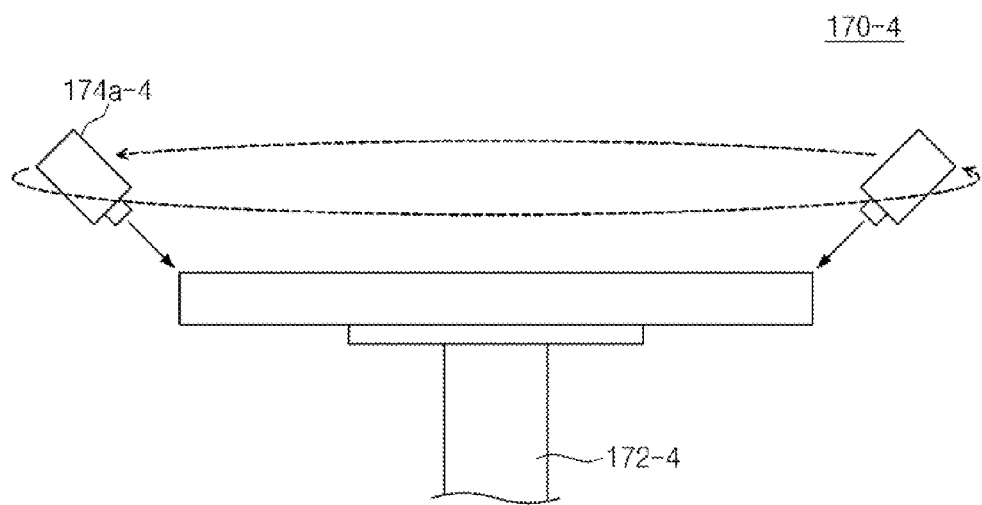
FIG. 9 is a cross-sectional view illustrating a wafer alignment unit according to exemplary embodiments of the inventive concept.

FIG. 9 is a cross-sectional view illustrating a wafer alignment unit according to an exemplary embodiment of the inventive concept. Referring to FIGS. 1 and 9, a wafer alignment unit 170-4 may be disposed in the frame 140 of the EFEM 100. The wafer alignment unit 170-4 may include an aligner 172-4 on which the wafer W is set and a notch detector 174a-4 detecting a notch of the wafer W. For example, the notch detector 174a-4 may be a camera taking a photograph of an edge sidewall of the wafer W. The notch detector 174a-4 may be located over or under the wafer W set on the aligner 172-4. The notch detector 174a-4 may be rotated on a center axis of the aligner 172-4. For example, the notch detector 174a-4 may move around the wafer W set on the aligner 172-4.

Methods of detecting the notch and aligning the wafer using the wafer alignment unit 170-4 described above will be described in more detail.

Here, for example, a main surface of the wafer, which patterns are formed on, may have the crystal plane. In this case, the notch may be formed at one of the crystal direction <110> of the wafer W as illustrated in FIGS. 10A to 10C. Alternatively, the notch may be formed at one of the crystal direction <100> of the wafer. Hereinafter, the wafer having the notch formed at one of the crystal direction <110> will be used as an example.

First, the first transfer robot 150 takes out the wafer W from the container C and then transfers the wafer W onto the aligner 172-4. The aligner 172-4 is fixed. For example, the wafer W is fixed. The notch detector 174a-4 takes a photograph of the edge sidewall of the wafers W as the notch detector 174a-4 moves around the fixed wafer W.

The image obtained by the notch detector 174a-4 is transmitted to a controller (not shown). The controller (not shown) rotates the aligner 172-4 so that the defected notch is not disposed in the non-uniform temperature gradient regions (e.g. corner regions) of the chamber housing 420. Since the notch may be formed at one of the crystal direction <110>, the crystal direction <110> of the wafer W are not disposed in the non-uniform temperature gradient regions (e.g. the corner regions) of the chamber housing 420 (FIGS. 10A and 10C).

Subsequently, the first transfer robot 150 loads the aligned wafer W into the loading chamber 220 of the load lock chamber 200 and then the second transfer robot 320 of the transfer chamber 300 takes out the aligned wafer W from the loading chamber 220. Subsequently, the second transfer robot 320 inserts the aligned wafer W into the process chamber 400. The aligned wafer W inserted in the process chamber 400 maintains the state aligned in the aligner 172-4. For example, the detected notch and the crystal direction <110> of the wafer W are not disposed at the non-uniform temperature gradient regions (e.g. the corner regions) of the chamber housing 420 (FIGS. 10A and 10C).

In the above case, the rapid thermal process (e.g. the flash lamp annealing process) is performed in the process chamber 400.

According to embodiments of the inventive concept described above, before the rapid thermal process, the defects and/or the crystal direction <110> of the wafer are detected and the wafer is aligned so that the detected defects and/or the detected crystal direction <110> of the wafer are not disposed in the non-uniform temperature gradient regions (e.g. the corner regions) of the chamber housing having the quadrangle-cross section. Thus, it is possible to prevent the wafer from being broken by the non-uniform temperature gradient of the corner regions the chamber housing during the rapid thermal process such as the milli-second annealing process.

According to embodiments of the inventive concept, it is possible to prevent the wafer from being broken during the rapid thermal process.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of thermally treating a wafer, comprising:
   detecting a defect in the wafer;
   loading the wafer into a process chamber having one or more regions of uniform temperature gradient and one or more regions of non-uniform temperature gradient;
   positioning the defect within one of the one or more regions of uniform temperature gradient; and
   performing a rapid thermal process on the wafer in the process chamber while the defect is positioned within one of the one or more regions of uniform temperature gradient.

2. The method of claim 1, wherein the process chamber has a hexahedron-shape and a quadrangle-cross section; and
   wherein the one or more regions of non-uniform temperature gradient regions correspond to corner regions of the quadrangle-cross section.

3. The method of claim 1, wherein the rapid thermal process is a flash lamp annealing process.

4. The method of claim 1, wherein detecting the defect of the wafer comprises:
   rotating the wafer; and
   taking a photograph of a surface of the wafer using a fixed camera.

5. The method of claim 1, wherein detecting the defect of the wafer comprises:
   fixing the wafer;
   moving a camera around the wafer; and
   taking a photograph of a surface of the wafer using the camera.

6. The method of claim 1, wherein detecting the defect of the wafer comprises:
   fixing the wafer;
   rotating an optical axis of a camera with respect to the wafer; and
   taking a photograph of a surface of the wafer using the camera.

7. The method of claim 1, further comprising:
   detecting crystal direction of the wafer;
   aligning the wafer such that a crystal direction of the wafer faces toward one of the one or more regions of uniform temperature gradient; and
   performing a rapid thermal process on the wafer in the process chamber while the crystal direction of the wafer faces the one of the one or more regions of uniform temperature gradient.

8. The method of claim 7, wherein detecting the crystal direction of the wafer comprises:
   rotating the wafer; and
   taking a photograph of a notch of the wafer using a fixed camera.

9. The method of claim 7, wherein detecting the crystal direction of the wafer comprises:
fixing the wafer;
moving a camera around the wafer; and
taking a photograph of a notch of the wafer using the camera.

10. The method of claim 1, wherein the process chamber comprises:
a chamber housing having a hexahedron-shape and a quadrangle-cross section;
a supporting member on which the wafer is set, the supporting member disposed in the chamber housing;
a first arc lamp disposed under the supporting member, the first arc lamp bulk-heating the wafer at a first temperature; and
a second arc lamp disposed over the supporting member, the second arc lamp heating the wafer for a period of time on the order of milliseconds at a second temperature higher than the first temperature,
wherein the wafer is aligned to locate the defect in a corner region of the chamber housing prior to loading the wafer on the supporting member.

11. A method of thermally treating a wafer, comprising:
detecting a defect in the wafer and a crystal direction of the wafer;
loading the wafer into a process chamber having one or more regions of uniform temperature gradient and one or more regions of non-uniform temperature gradient;
positioning the defect within one of the one or more regions of uniform temperature gradient and to face the crystal direction of the wafer toward one of the one or more regions of uniform temperature gradient of the process chamber; and
performing a rapid thermal process on the wafer in the process chamber while the crystal direction of the wafer faces towards the one of the one or more regions of uniform temperature gradient of the process chamber.

12. The method of claim 11, wherein the process chamber has a hexahedron-shape and a quadrangle-cross section; and
wherein the non-uniform temperature gradient regions are corner regions of the quadrangle-cross section.

13. The method of claim 11, wherein detecting the crystal direction of the wafer comprises:
rotating the wafer; and
taking a photograph of a notch of the wafer using a fixed camera.

14. The method of claim 11, wherein detecting the crystal direction of the wafer comprises:
fixing the wafer;
moving a camera around the wafer; and
taking a photograph of a notch of the wafer using the camera.

15. The method of claim 11, wherein the rapid thermal process is a flash lamp annealing process.

* * * * *